(12) United States Patent
Liu et al.

(10) Patent No.: US 8,053,291 B2
(45) Date of Patent: Nov. 8, 2011

(54) METHOD FOR MAKING THIN FILM TRANSISTOR COMPRISING FLOCCULATING OF CARBON NANOTUBES

(75) Inventors: Chang-Hong Liu, Beijing (CN); Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 132 days.

(21) Appl. No.: 12/384,310

(22) Filed: Apr. 2, 2009

(65) Prior Publication Data

US 2009/0298239 A1    Dec. 3, 2009

(30) Foreign Application Priority Data

May 30, 2008    (CN) .......................... 2008 1 0067565

(51) Int. Cl.
H01L 21/00 (2006.01)
H01L 21/84 (2006.01)
(52) U.S. Cl. ................ 438/151; 438/478; 257/E21.128; 977/938
(58) Field of Classification Search .................... None
See application file for complete search history.

(56) References Cited

U.S. PATENT DOCUMENTS

| | | | |
|---|---|---|---|
| 6,423,583 B1 | 7/2002 | Avouris et al. | |
| 6,814,832 B2 | 11/2004 | Utsunomiya | |
| 6,899,945 B2 * | 5/2005 | Smalley et al. | 428/314.8 |
| 6,921,575 B2 * | 7/2005 | Horiuchi et al. | 428/367 |
| 7,051,945 B2 | 5/2006 | Empedocles et al. | |
| 7,253,431 B2 | 8/2007 | Afzali-Ardakani et al. | |
| 7,285,501 B2 | 10/2007 | Mardilovich et al. | |
| 7,323,730 B2 | 1/2008 | Borghetti et al. | |
| 7,359,888 B2 | 4/2008 | Snider | |
| 7,399,400 B2 | 7/2008 | Soundarrajan et al. | |
| 7,537,975 B2 | 5/2009 | Moon et al. | |
| 7,812,342 B2 | 10/2010 | Lee et al. | |
| 7,838,809 B2 | 11/2010 | Ludwig | |
| 2002/0163079 A1 | 11/2002 | Awano | |

(Continued)

FOREIGN PATENT DOCUMENTS

CN          1484865        3/2004

(Continued)

OTHER PUBLICATIONS

Meitl et al., Solution Casting and Transfer Printing Single-Walled Carbon Nanotube Films, Nano Letters, 2004, vol. 4, No. 9, pp. 1643-1647.*

(Continued)

Primary Examiner — Thanh V Pham
Assistant Examiner — Andres Munoz
(74) Attorney, Agent, or Firm — Altis Law Group, Inc.

(57) ABSTRACT

A method for making a thin film transistor, the method includes the steps of: providing a plurality of carbon nanotubes and an insulating substrate; flocculating the carbon nanotubes to acquire a carbon nanotube structure, applying the carbon nanotube structure on the insulating substrate; forming a source electrode, a drain electrode, and a gate electrode; and covering the carbon nanotube structure with an insulating layer. The source electrode and the drain electrode are connected to the carbon nanotube structure, the gate electrode is electrically insulated from the carbon nanotube structure by the insulating layer.

16 Claims, 7 Drawing Sheets

U.S. PATENT DOCUMENTS

| | | |
|---|---|---|
| 2004/0251504 A1 | 12/2004 | Noda |
| 2005/0061496 A1 | 3/2005 | Matabayas, Jr. |
| 2005/0079659 A1 | 4/2005 | Duan et al. |
| 2005/0106846 A1* | 5/2005 | Dubin .......................... 438/585 |
| 2005/0189535 A1* | 9/2005 | Hsueh et al. .................... 257/40 |
| 2006/0137817 A1* | 6/2006 | Ma et al. ...................... 156/296 |
| 2006/0249817 A1 | 11/2006 | Kawase et al. |
| 2007/0004191 A1* | 1/2007 | Gu et al. ........................ 438/618 |
| 2007/0012922 A1 | 1/2007 | Harada et al. |
| 2007/0029612 A1 | 2/2007 | Sandhu |
| 2007/0069212 A1 | 3/2007 | Saitoh et al. |
| 2007/0085460 A1* | 4/2007 | Harutyunyan et al. ....... 313/309 |
| 2007/0108480 A1 | 5/2007 | Nanai et al. |
| 2007/0132953 A1 | 6/2007 | Silverstein |
| 2007/0138010 A1 | 6/2007 | Ajayan |
| 2007/0228439 A1 | 10/2007 | Duan et al. |
| 2007/0273796 A1 | 11/2007 | Silverstein et al. |
| 2007/0273797 A1 | 11/2007 | Silverstein et al. |
| 2007/0273798 A1 | 11/2007 | Silverstein et al. |
| 2008/0042287 A1 | 2/2008 | Furukawa et al. |
| 2008/0121996 A1 | 5/2008 | Park et al. |
| 2008/0134961 A1 | 6/2008 | Bao et al. |
| 2008/0173864 A1 | 7/2008 | Fujita et al. |
| 2008/0252202 A1* | 10/2008 | Li et al. ......................... 313/504 |
| 2008/0265293 A1 | 10/2008 | Lee et al. |
| 2008/0277718 A1 | 11/2008 | Ionescu et al. |
| 2009/0072223 A1 | 3/2009 | Awano |
| 2009/0098453 A1 | 4/2009 | Liu et al. |
| 2009/0159891 A1 | 6/2009 | Daniel et al. |
| 2009/0224230 A1 | 9/2009 | Pesetski et al. |
| 2009/0224292 A1 | 9/2009 | Asano et al. |
| 2009/0256594 A1 | 10/2009 | Zhu |
| 2009/0272967 A1 | 11/2009 | Afzali-Ardakani et al. |
| 2009/0282802 A1 | 11/2009 | Cooper et al. |
| 2010/0028613 A1 | 2/2010 | Schmidt et al. |
| 2010/0108988 A1 | 5/2010 | Grebel et al. |
| 2010/0252802 A1 | 10/2010 | Numata et al. |

FOREIGN PATENT DOCUMENTS

| | | |
|---|---|---|
| CN | 1490856 A | 4/2004 |
| CN | 1745468 | 3/2006 |
| CN | 1823426 | 8/2006 |
| CN | 1853268 | 10/2006 |
| JP | 2007-73706 | 3/2007 |
| JP | 2007-123870 | 5/2007 |
| WO | WO2004032193 | 4/2004 |
| WO | WO 2005114708 A2 * | 12/2005 |
| WO | WO2006093601 A2 | 9/2006 |
| WO | WO2007089322 | 8/2007 |
| WO | WO2007126412 | 11/2007 |
| WO | WO2008075642 | 6/2008 |

OTHER PUBLICATIONS

Minko et al. "Two-level structured self-adaptive surfaces with reversibly tunable properties", Journal of American Chemical Society, 125, pp. 3896-3900, 2003.

R. E. I. Schropp, B. Stannowski, J. K Rath, New challenges in thin film transistor research, Journal of Non Crystalline Solids, 299-302, 2002,1304-1310,2002.

IBM research article on IBM research site (enclosed herein, 2004).

Jiang et al. ("Spinning and processing continuous yarns from 4-inch wafer scale super-aligned carbon nanotube arrays", Advanced Materials, 18, pp. 1505-1510, 2006).

Li "Removal of shells of multi-wall carbon nanotubes by repeatedly scanning bias voltage" Science in China Ser. E, Technological Sciences, vol. 47 No. 1 pp. 1-5 (2004).

Hines "Nanotransfer printing of organic and carbon nanotube thin-film transistors on plastic substrates", Applied Physics Letters,86,163101 (2005).

Ryu "Low-Temperature Growth of Carbon Nanotube by Plasma-Enhanced Chemical Vapor Deposition using Nickel Catalyst". Jpn. J. Appl. Phys. vol. 42, pp. 3578-3581 (2003).

* cited by examiner

METHOD FOR MAKING THIN FILM TRANSISTOR COMPRISING FLOCCULATING OF CARBON NANOTUBES

RELATED APPLICATIONS

This application is related to commonly-assigned applications entitled, "THIN FILM TRANSISTOR", Ser. No. 12/384,309, filed on Apr. 2, 2009; "METHOD FOR MAKING THIN FILM TRANSISTOR", Ser. No. 12/384,331, filed on Apr. 2, 2009; "THIN FILM TRANSISTOR", Ser. No. 12/384,329, filed on Apr. 2, 2009; "METHOD FOR MAKING THIN FILM TRANSISTOR", Ser. No. 12/384,245, filed on Apr. 2, 2009; "THIN FILM TRANSISTOR PANEL", Ser. No. 12/384,244, filed on Apr. 2, 2009; "THIN FILM TRANSISTOR", Ser. No. 12/384,281, filed on Apr. 2, 2009; "THIN FILM TRANSISTOR", Ser. No. 12/384,299, filed on Apr. 2, 2009; "THIN FILM TRANSISTOR", Ser. No. 12/384,292, filed on Apr. 2, 2009; "THIN FILM TRANSISTOR", Ser. No. 12/384,293, filed on Apr. 2, 2009; "THIN FILM TRANSISTOR", Ser. No. 12/384,330, filed on Apr. 2, 2009; "METHOD FOR MAKING THIN FILM TRANSISTOR", Ser. No. 12/384,241, filed on Apr. 2, 2009; "THIN FILM TRANSISTOR", Ser. No. 12/384,238, filed on Apr. 2, 2009. The disclosures of the above-identified applications are incorporated herein by reference.

BACKGROUND

1. Technical Field

The present disclosure relates to methods for making thin film transistors and, particularly, to a method for making a carbon nanotube based thin film transistor.

2. Discussion of Related Art

A typical thin film transistor (TFT) is made of a substrate, a gate electrode, an insulation layer, a drain electrode, a source electrode, and a semiconducting layer. The thin film transistor performs a switching operation by modulating an amount of carriers accumulated in an interface between the insulation layer and the semiconducting layer from an accumulation state to a depletion state, with applied voltage to the gate electrode, to change an amount of the current passing between the drain electrode and the source electrode. In practical use, a high carrier mobility affect by the material of the semiconducting layer of the thin film transistor is desired.

Usually, the material of the semiconducting layer is amorphous silicone (a-Si), poly-silicone (p-Si), or organic semiconducting material. The carrier mobility of an a-Si TFT is relatively lower than a p-Si TFT. However, the method for making the p-Si TFT is complicated and costly. The organic TFT is flexible but has low carrier mobility.

Carbon nanotubes (CNTs) are a novel carbonaceous material and have received a great deal of interest since the early 1990s. Carbon nanotubes have interesting and potentially useful heat conducting, electrical conducting, and mechanical properties. Further, there are two kinds of carbon nanotubes: metallic carbon nanotubes and semiconducting carbon nanotubes determined by small differences in the diameter and chirality affect. The carrier mobility of semiconducting carbon nanotubes along a length direction thereof can reach about 1000 to 1500 $cm^2V^{-1}s^{-1}$. TFTs adopting semiconducting carbon nanotubes as a semiconducting layer have been produced.

Methods for making carbon nanotube based TFTs include the following steps: dispersing an amount of carbon nanotube powder in an organic solvent to form a mixture; printing the mixture on a substrate; volatilizing the organic solvent to achieve a carbon nanotube layer on the substrate; forming a source electrode and a drain electrode on the carbon nanotube layer; forming a silicon nitride layer on the carbon nanotube layer; and forming a gate electrode on the insulating layer.

However, there are problems with the present methods for making carbon nanotube based TFTs. Firstly, the carbon nanotubes are prone to aggregate in the mixture. Thus, it is difficult to uniformly disperse the carbon nanotubes in the mixture. To achieve uniform dispersion of the carbon nanotubes in the mixture, an agitating step must be provided, which complicates the process. During the agitating step, a large part of the carbon nanotubes is wasted, and the utilization of the carbon nanotubes is relatively low. Secondly, the concentration of the carbon nanotubes dispersed in the mixture is relatively low. Additionally, the carbon nanotube layer formed by the printing method is inflexible. Accordingly, the TFT is inflexible.

Therefore, there is a need to make a carbon nanotube TFT that has better dispersion and concentration of CNTs.

BRIEF DESCRIPTION OF THE DRAWINGS

Many aspects of the present method for making the thin film transistor can be better understood with references to the following drawings. The components in the drawings are not necessarily drawn to scale, the emphasis instead being placed upon clearly illustrating the principles of the present method for making the carbon nanotube based thin film transistor.

Figure 1:
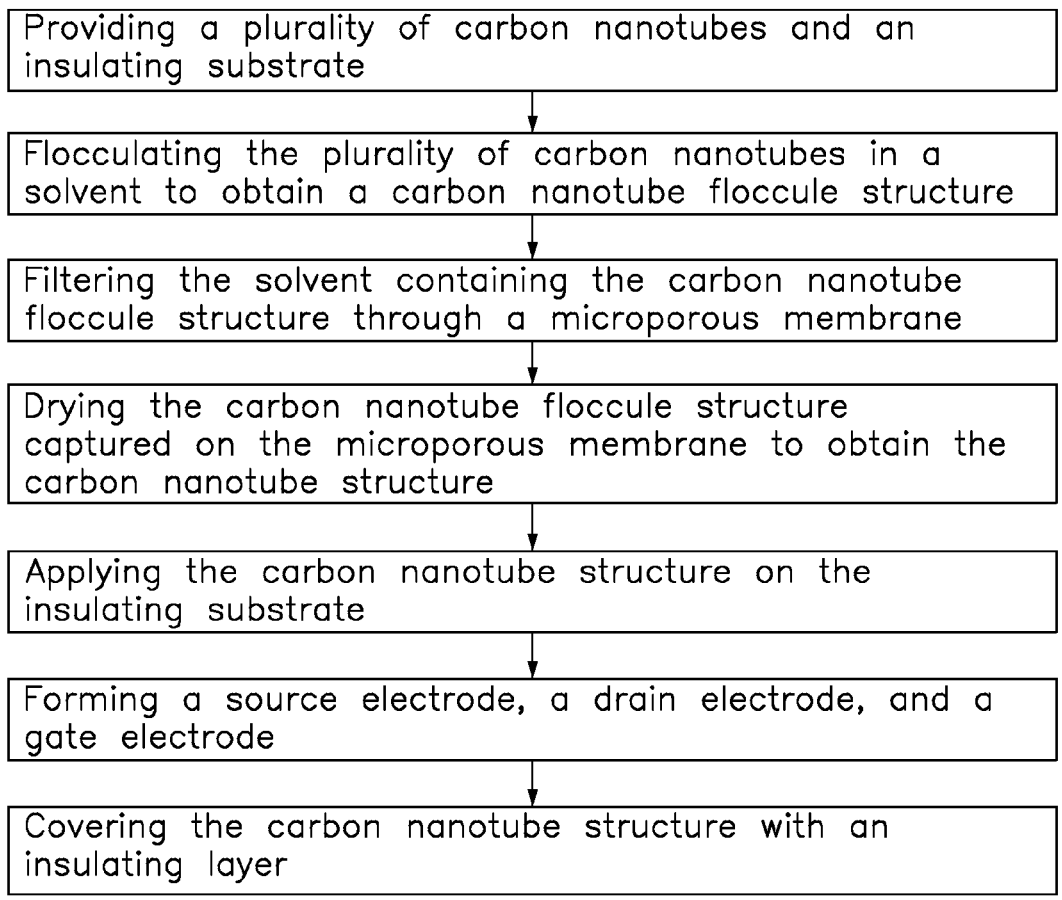
FIG. 1 is a flow chart of a method for making a thin film transistor in accordance with a first embodiment.

Corresponding reference characters indicate corresponding parts throughout the several views. The exemplifications set out herein illustrate at least one embodiment of the present method for making the thin film transistor, in at least one form, and such exemplifications are not to be construed as limiting the scope of the invention in any manner.

DETAILED DESCRIPTION OF EXEMPLARY EMBODIMENTS

References will now be made to the drawings to describe, in detail, embodiments of the present method for making the thin film transistor.

Figure 2:
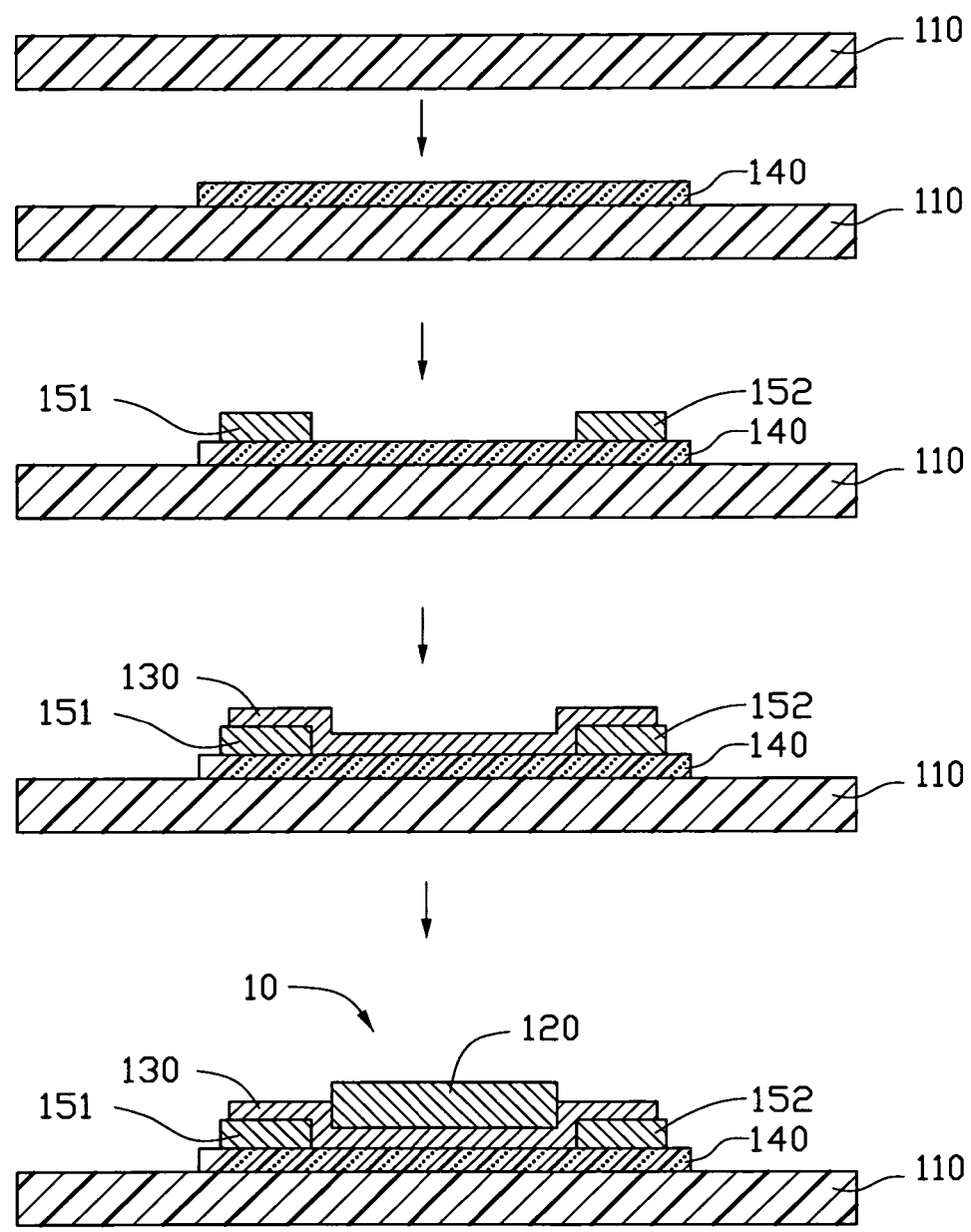
FIG. 2 is a schematic view of the method for making the thin film transistor of FIG. 1.

Referring to FIG. 1 and FIG. 2, a method for making a thin film transistor 10 having a top gate structure is provided in a first embodiment, and includes the following steps:

(a) providing a plurality of carbon nanotubes and an insulating substrate 110;

(b) flocculating the carbon nanotubes to acquire a carbon nanotube structure 140;

(c) applying the carbon nanotube structure 140 on the insulating substrate 110;

(d) forming a source electrode 151, a drain electrode 152, and a gate electrode 120; and (e) covering the carbon nanotube structure 140 with an insulating layer 130;

wherein the source electrode 151 and the drain electrode 152 are spaced from each other, and electrically connected to the carbon nanotube structure 140; the gate electrode 120 is electrically insulated from the carbon nanotube structure 140 by the insulating layer 130.

In step (a), the material of the insulating substrate 110 can be the same as what is used to make a substrate of a printed circuit board (PCB), and can be selected from a rigid material (e.g., p-type or n-type silicon, silicon with a silicon dioxide layer formed thereon, glass, crystal, crystal with an oxide layer formed thereon), or a flexible material (e.g., plastic, polymer, or resin). In the present embodiment, the material of the insulating substrate is polyethylene terephthalate (PET). The shape and size of the insulating substrate 110 is arbitrary.

In step (a), the carbon nanotubes can be provided by the following steps of: (a1) providing a substantially flat and smooth base; (a2) forming a catalyst layer on the base; (a3) annealing the base with the catalyst layer in air at a temperature in a range from about 700° C. to about 900° C. for about 30 to 90 minutes; (a4) heating the base with the catalyst layer to a temperature in a range from about 400° C. to about 740° C. in a furnace with a protective gas therein; (a5) supplying a carbon source gas to the furnace for about 5 to 30 minutes and growing the carbon nanotubes on the base; and (a6) separating the carbon nanotubes from the base.

In step (a1), the base can be a P-type silicon wafer, an N-type silicon wafer, or a silicon wafer with a film of silicon dioxide thereon. In this embodiment, a 4-inch P-type silicon wafer is used as the base.

In step (a2), the catalyst can be made of iron (Fe), cobalt (Co), nickel (Ni), magnesium (Mg), or any alloy thereof. A thickness of the catalyst layer is in a range from several nanometers to hundreds of nanometers (e.g., from 5 nanometers to 100 nanometers). In the present embodiment, the material of the catalyst layer is Fe. The thickness of the catalyst layer is about 0.1 nanometers to 3 nanometers. The very thin catalyst layer helps the growing of the single-walled carbon nanotubes.

In step (a4), the protective gas can be made up of at least one of nitrogen ($N_2$), ammonia ($NH_3$), and a noble gas.

In step (a5), the carbon source gas can be a hydrocarbon gas, such as ethylene ($C_2H_4$), methane ($CH_4$), acetylene ($C_2H_2$), ethane ($C_2H_6$), carbon oxide (CO), or any combination thereof. In the present embodiment, the temperature approximately ranges from 500° C. to 740° C. Further, a carrier gas is introduced with a carbon source gas in a mixture form. The carbon source gas and the carrier gas are at a ratio ranging from 100:1 to 100:10. The mass flow of the carrier gas can be about 500 standard-state cubic centimeters per minute (sccm). The mass flow of the carbon source gas can be in an approximate range from 5 to 50 sccm. In the present embodiment, the mass flow of the carbon source gas is 20 sccm, and the carrier gas is hydrogen.

The number of the walls of the carbon nanotubes growing in step (a) relates to the ratio of the carrier gas and the carbon source gas. When the ratio of the carrier gas and the carbon source gas is in the approximate range from 100:1 to 100:10, the carbon nanotubes are single-walled carbon nanotubes, and the diameters of each is in the range from about 0.5 nanometers to about 10 nanometers. In the present embodiment, the diameter of each of the carbon nanotubes is about 2 nanometers. The carbon nanotubes have a relatively long length (e.g., above 100 microns).

In step (a6), the carbon nanotubes can be shaved (or scratched) from the base by a tool, e.g. a knife. The shaved carbon nanotubes keep an entangled state.

In step (b), the flocculating process includes the substeps of: (b1) flocculating the carbon nanotubes in a solvent to get a carbon nanotube floccule structure; (b2) removing the solvent to obtain a carbon nanotube structure 140.

In step (b1), the solvent can be selected from the group consisting of water and volatile organic solvent. After adding the carbon nanotubes to the solvent, a process of flocculating is executed to obtain the carbon nanotube floccule structure. The process of flocculating can be selected from the ultrasonic dispersion and high-strength agitating/vibrating. In this embodiment, the ultrasonic dispersion is used to flocculate mixture of the solvent and the carbon nanotubes for about 10~30 minutes. Due to the carbon nanotubes in the solvent having a large specific surface area and the carbon nanotubes having a large van der Waals attractive force, the flocculated carbon nanotubes form an entangled structure.

In step (b2), the process of removing the solvent includes the substeps of: filtering the solvent containing the carbon nanotube floccule structure through a microporous membrane and into an air-pumping funnel; and air-pumping and drying the carbon nanotube floccule structure captured on the microporous membrane to obtain the carbon nanotube structure 140.

The microporous membrane has a smooth surface. The diameters of micropores in the membrane are about 0.22 microns. By provision of pumping and filtration, air pressure can be exerted on the carbon nanotube floccule structure, thereby forming the uniform carbon nanotube structure 140. Moreover, due to the microporous membrane having a smooth surface, the carbon nanotube structure 140 can be easily separated from the membrane.

In step (c), the carbon nanotube structure 140 is cut into a predetermined shape, and is attached to the surface of the insulating substrate 110.

Step (b) can be also accomplished by the substeps of: (b1') flocculating the carbon nanotubes in a solvent to obtain a carbon nanotube floccule structure; (b2') separating the carbon nanotube floccule structure from the solvent, and (b3') shaping the separated carbon nanotube floccule structure.

Additionally, step (b2') includes the substeps of: pouring the solvent containing the carbon nanotube floccule structure into a funnel having a filter; and drying the carbon nanotube floccule structure on the filter to obtain the carbon nanotube floccule structure free of solvent.

In step (b2'), a drying time can be selected according to practical needs. The carbon nanotube floccule structure on the filter is bundled together, so as to form an irregular carbon nanotube flocculate structure.

In step (b3'), the process of shaping the separated carbon nanotube floccule structure into the carbon nanotube structure 140 includes the substeps of: putting the carbon nanotube floccule structure on a board (e.g., the insulating substrate 110), and working the carbon nanotube floccule structure into a predetermined shape; pressing the worked carbon nanotube floccule structure with pressure to yield a desirable shape; and drying, if needed, the spread carbon nanotube floccule structure to remove the residual solvent to form the carbon nanotube structure 140.

In step (b3'), the raw carbon nanotube floccule structure is pressed with a certain pressure to yield a desirable shape and is cut into sizes of the insulating substrate 110.

In step (c), the carbon nanotube structure 140 is adhered on the surface of the insulating substrate 110 to form a transparent conductive layer thereon.

It is to be understood that the carbon nanotube floccule structure can be directly disposed on the insulating substrate 110 and then pressed to form the carbon nanotube structure 140.

It is to be understood that the size of the spread carbon nanotube floccule structure is used to control a thickness and a surface density of the carbon nanotube structure 140 and can be adjusted as needed. As such, the larger the area of a given amount of the carbon nanotube floccule structure is spread over, the less the thickness and the density of the carbon nanotube structure 140.

Figure 3:
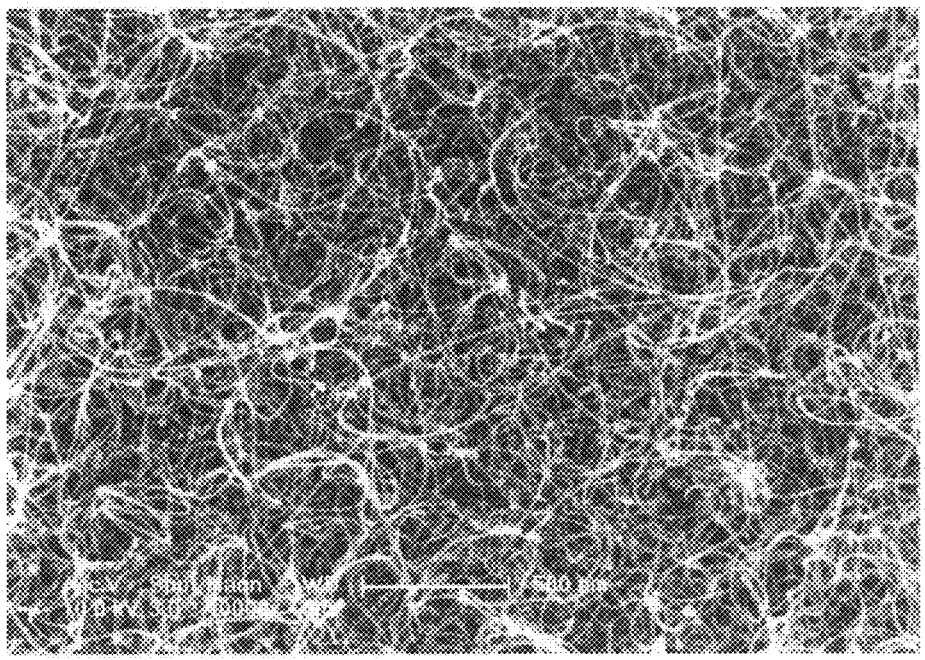
FIG. 3 shows a Scanning Electron Microscope (SEM) image of a carbon nanotube structure used in the thin film transistor of FIG. 1.

Referring to FIG. 3, in the carbon nanotube structure 140, the diameters of the carbon nanotubes are relatively small (e.g., about 0.5 nanometers to 10 nanometers), and the lengths of the carbon nanotubes are relatively long (e.g., about 100 nanometers to 10 millimeters). The carbon nanotubes are disordered, curved and entangled one another.

It is noted that due to the large specific area, the carbon nanotube structure 140 is adhesive in nature. As such, the carbon nanotube structure 140 can be directly adhered to the surface of the insulating substrate 110 in step (c).

Further, when the insulating substrate 110 is made of flexible material (e.g., PET), an additional hot pressing step (h) can be further provided after step (c). In step (h), the insulating substrate 110 with the carbon nanotube structure 140 thereon can be disposed in a hot pressing machine. After hot pressing in step (h), the carbon nanotube structure 140 can be firmly adhered on the surface of the insulating substrate 110. By hot pressing, the insulating substrate 110 can be partially melted and the carbon nanotube structure 140 can be partially embedded or absorbed in the insulating substrate 110.

In step (d), the materials of the source electrode 151, the drain electrode 152, and the gate electrode 120 have a good conductive property, and can be selected from a group consisting of pure metals, metal alloys, indium tin oxide (ITO), antimony tin oxide (ATO), silver paste, conductive polymer, and metallic carbon nanotubes. A thickness of the source electrode 151, the drain electrode 152, and the gate electrode 120 is about 0.5 nanometers to 100 microns. A distance between the source electrode 151 and the drain electrode 152 is about 1 micron to about 100 microns.

In one embodiment, the source electrode 151, the drain electrode 152, and the gate electrode 120 can be formed by depositing or sputtering methods. In another embodiment, the source electrode 151, the drain electrode 152, and the gate electrode 120 made of silver paste or conductive polymer and can be formed directly by a printing method. In other embodiments, two carbon nanotube films with metallic carbon nanotube therein can be separately adhered onto the substrate or the carbon nanotube structure 140 to form the source electrode 151 and the drain electrode 152, and can be adhered onto the insulating layer 130 to form the gate electrode 120.

The source electrode 151 and the drain electrode 152 are separately located on two ends of the carbon nanotube structure 140. A carrier channel from the source electrode 151 to the drain electrode 152 is defined in the carbon nanotube structure 140.

The material of the source electrode 151, the drain electrode 152, and the gate electrode 120 is pure metal, and step (e) can be performed by a lift-off method or an etching method. The thickness of the source electrode 151 and the drain electrode 152 is about 1 micron. The distance between the source electrode 151 and the drain electrode 152 is about 50 microns.

It is to be understood that, to achieve a semiconducting layer, an additional step (g) of eliminating the metallic carbon nanotubes in the carbon nanotube structure 140 can be further provided. In one embodiment, the step (g) can be performed after step (d), by applying a voltage between the source electrode 151 and the drain electrode 152, to break down the metallic carbon nanotubes in the carbon nanotube structure 140, and thereby achieve a semiconducting layer free of metallic carbon nanotubes therein. The voltage is in a range from 1 to 1000 volts (V). In other embodiments, the step (g) can be performed after step (c), by irradiating the carbon nanotube structure 140 with a hydrogen plasma, microwave, terahertz (THz), infrared (IR), ultraviolet (UV), or visible light (Vis), to break down the metallic carbon nanotubes in the carbon nanotube structure 140, and thereby achieve a semiconducting layer free of metallic carbon nanotubes therein.

In step (e), the material of the insulating layer 130 can be a rigid material such as silicon nitride ($Si_3N4$) or silicon dioxide ($SiO_2$), or a flexible material such as PET, benzocyclobutenes (BCB), or acrylic resins. The insulating layer 130 can be formed by a depositing, sputtering, evaporating, or printing method according to the material thereof. A thickness of the insulating layer 130 can be in a range from about 0.5 nanometers to about 100 microns.

In the present embodiment, a $Si_3N_4$ insulating layer 130 is deposited on the carbon nanotube structure 140, the source electrode 151, and the drain electrode 152 by a PECVD method. The thickness of the insulating layer 130 is about 1 micron.

To be used in a device (e.g., a display), the insulating layer 130 can be further etched or applied in such a manner to form exposure holes to expose a part of the source electrode 151, and the drain electrode 152.

Figure 4:
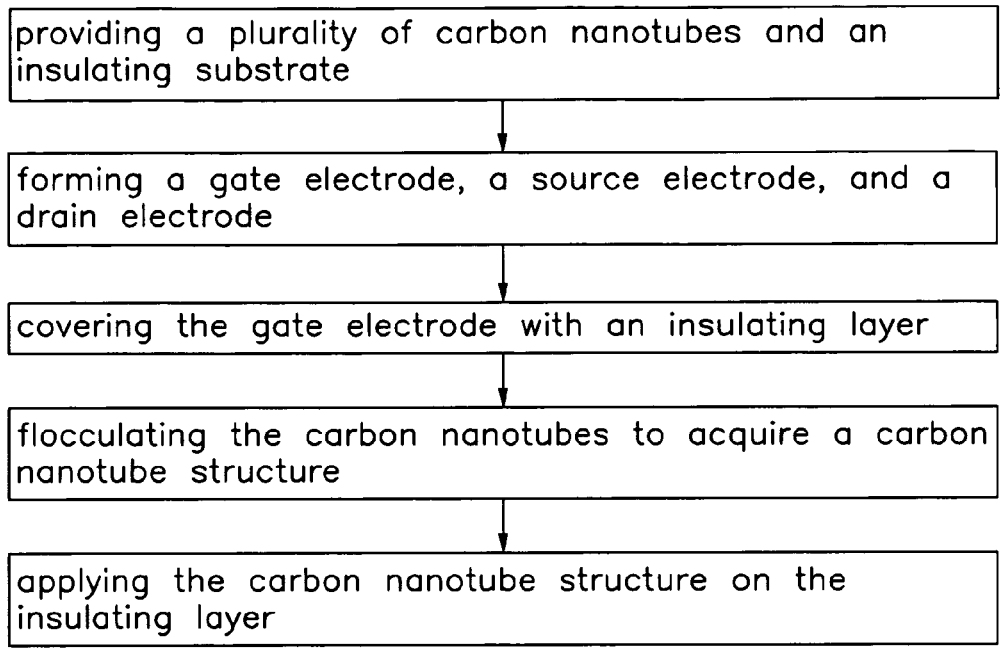
FIG. 4 is a flow chart of a method for making a thin film transistor in accordance with a second embodiment.
Figure 5:
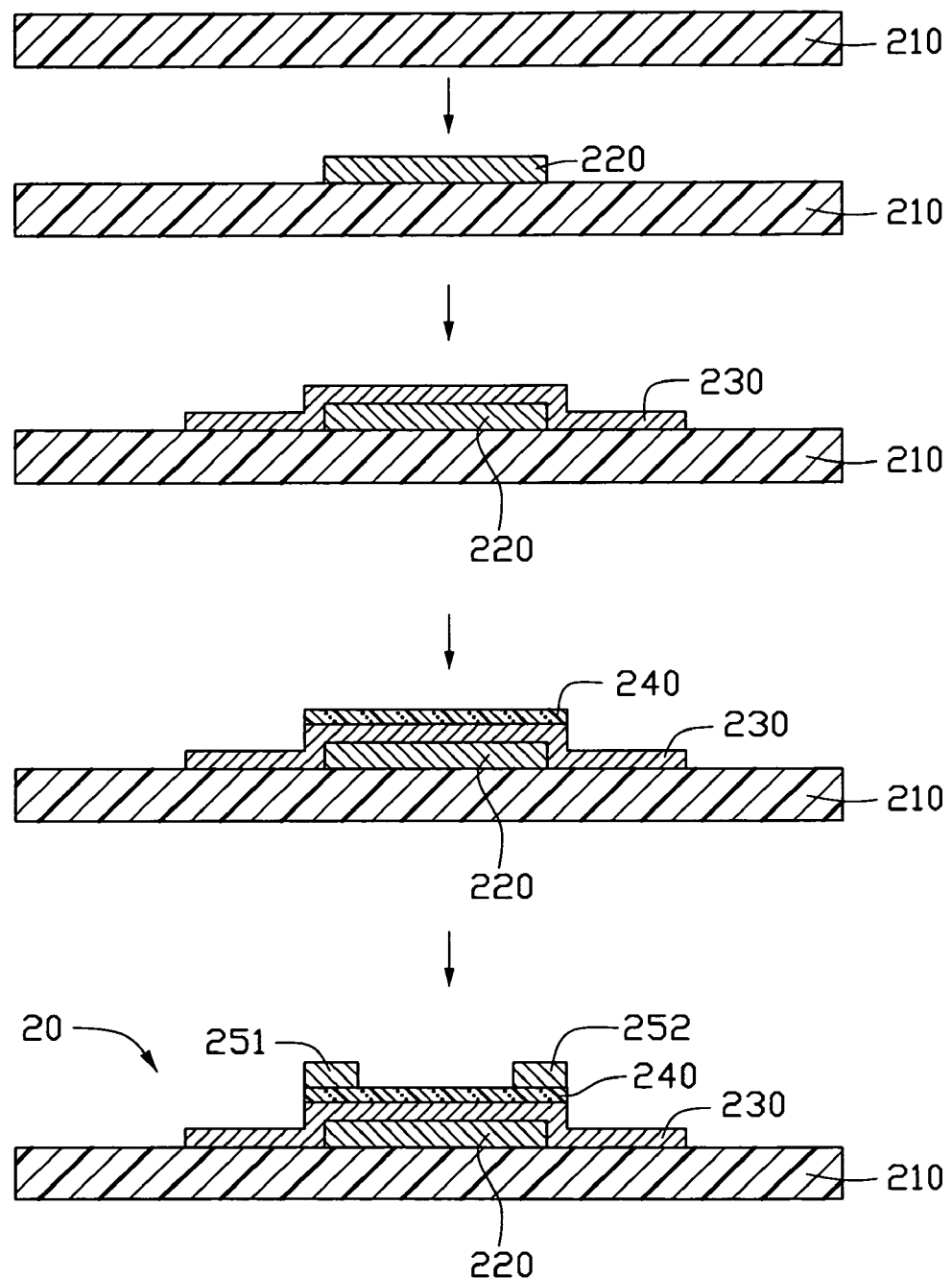
FIG. 5 is a schematic view of the method for making the thin film transistor of FIG. 4.

Referring to FIG. 4 and FIG. 5, a method for making the thin film transistor 20 having a bottom gate structure is provided in a second embodiment, and is substantially the same as the method form making the thin film transistor 10 in the first embodiment. The main difference between the two methods is that the thin film transistor 20 has a bottom gate structure.

The method for making the thin film transistor 20 includes steps of:
 (a') providing a plurality of carbon nanotubes and an insulating substrate 210;
 (b') forming a gate electrode 220, a source electrode 251, and a drain electrode 252;
 (c') covering the gate electrode 220 with a insulating layer 230;
 (d') flocculating the carbon nanotubes to acquire a carbon nanotube structure 240; and
 (e') applying the carbon nanotube structure 240 on the insulating layer 230;
wherein the gate electrode 220 is located on a surface of the insulating substrate 210; the source electrode 251 and the drain electrode 252 are spaced from each other, and electrically connected to the carbon nanotube structure 240; the carbon nanotube structure 240 is insulated from the gate electrode 220 by the insulating layer 230.

Figure 6:
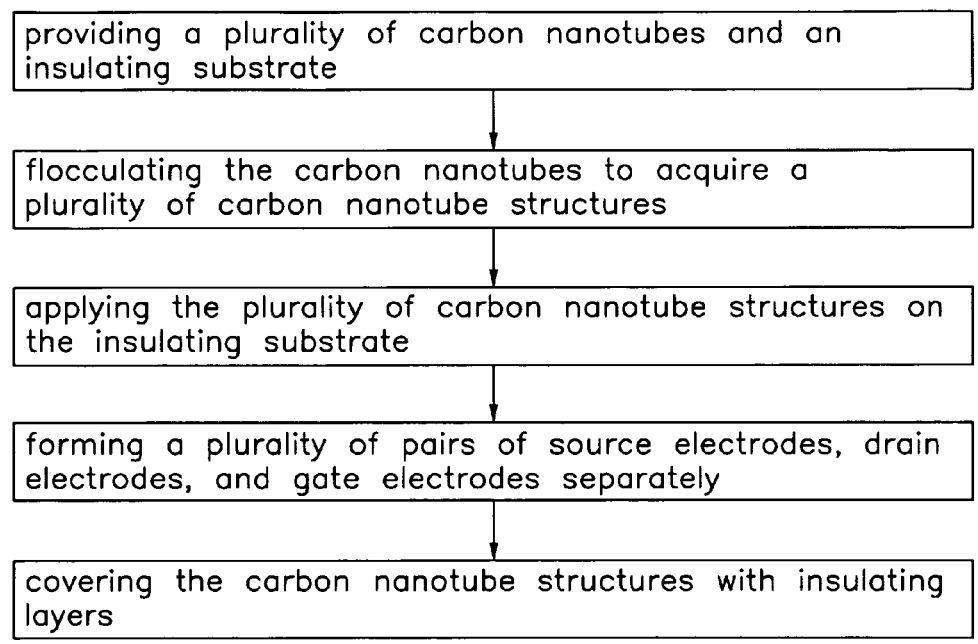
FIG. 6 is a flow chart of a method for making a thin film transistor in accordance with a third embodiment.

Referring to FIG. 6, a method for making an array of thin film transistors is provided in a third embodiment, and is substantially the same as the method for making the thin film transistor 10 in the first embodiment. The main difference is that, in the third embodiment, a plurality of thin film transistors is formed on the same substrate, thereby achieving the array of thin film transistors.

The method for making the array of thin film transistors includes steps of:
 (a") providing a plurality of carbon nanotubes and an insulating substrate;

(b") flocculating the carbon nanotubes to acquire a plurality of carbon nanotube structures;

(c") applying the carbon nanotube structures on the insulating substrate;

(d") forming a plurality of pairs of source electrodes, drain electrodes, and gate electrodes separately; and (e") covering the carbon nanotube structures with insulating layers;

wherein the source electrodes and the drain electrodes are spaced from each other, and electrically connected to the carbon nanotube structures, the gate electrodes are opposite to and electrically insulated from the carbon nanotube structures by the insulating layers.

In steps (b") and (c"), a single large area carbon nanotube structures can be formed on the insulating substrate. Then, the carbon nanotube structures can be cut by laser beam, or etched by plasma to form a plurality of small-area carbon nanotube structures arranged along columns and rows or any other desired design. In another embodiment, a plurality of small-area carbon nanotube structures can be formed by the flocculating step and adhered on the insulating substrate separately.

In step (d"), a conductive layer can be formed on the entire carbon nanotube structures, and patterned by an etching step to form a plurality of source electrodes and drain electrodes separately connected to the carbon nanotube layers. Further, when the insulating layers cover the carbon nanotube structures, another conductive layer can be formed on the entire insulating structures, and patterned by an etching step to form a plurality of gate electrodes opposite to the carbon nanotube structures.

In step (e"), an insulating layer can be formed on the whole carbon nanotube structures, source electrodes and drain electrodes, and then patterned by an etching step to form a plurality of insulating layers corresponding to the carbon nanotube structures.

Figure 7:
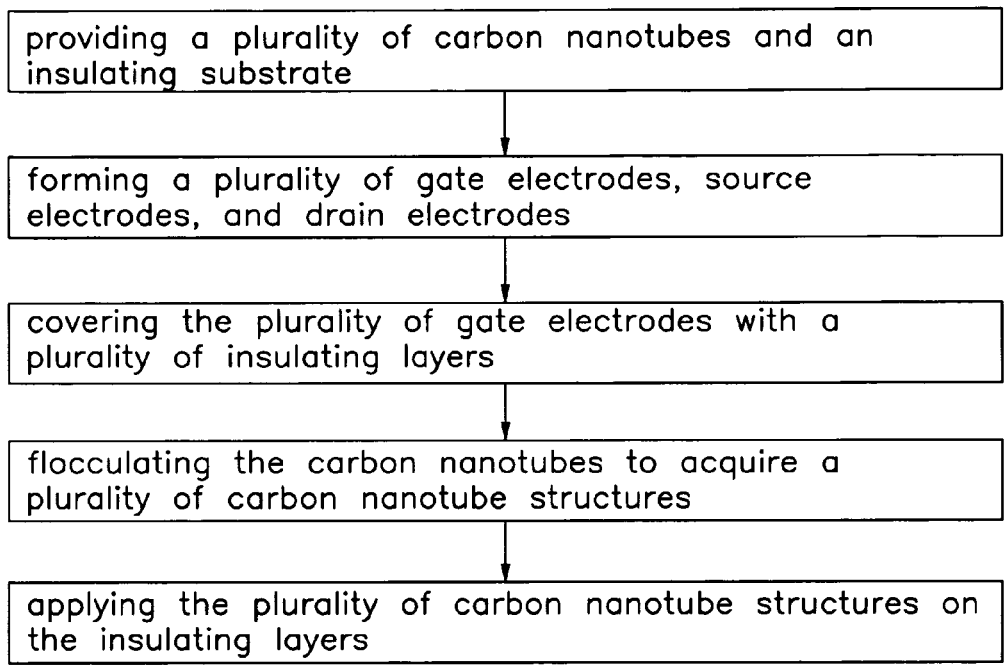
FIG. 7 is a flow chart of a method for making a thin film transistor in accordance with a fourth embodiment.

It is to be understood that, the array of thin film transistors can be formed in a similar way of the second embodiment. Referring to FIG. 7, in a fourth embodiment, the method for forming the array of thin film transistors includes following steps of:

(a''') providing a plurality of carbon nanotubes and an insulating substrate;

(b''') forming a plurality of gate electrodes, source electrodes, and drain electrodes;

(c''') covering the plurality of gate electrodes with a plurality of insulating layers; and (d''') flocculating the carbon nanotubes to acquire a plurality of carbon nanotube structures; and (e''') applying the plurality of carbon nanotube structures on the insulating layers;

wherein the gate electrodes are located on a surface of the insulating substrate; the source electrodes and the drain electrodes are spaced from each other, and electrically connected to the single-walled carbon nanotube layers, the carbon nanotube layers are opposite to and insulated from the gate electrodes by the insulating layers.

The method for making the thin film transistor provided in the present embodiments has the following superior properties. Firstly, the flocculating method is relatively easier to acquire the carbon nanotube structure with carbon nanotubes uniformly dispersed therein. The total amount of the carbon nanotubes can be used to form the carbon nanotube structure resulting in little waste. Secondly, the carbon nanotubes in the carbon nanotube layer entangle with each other to improve the toughness and flexibility of the carbon nanotube layer. Thus, the flexibility of the thin film transistor can be improved. Thirdly, the carbon nanotube structure is adhesive and can be easily adhered in a desired location. Thus, the carbon nanotube structure can be easily adhered on the insulating substrate directly. The material of the insulating substrate can be selected from a flexible plastic or resin.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

It is also to be understood that above description and the claims drawn to a method may include some indication in reference to certain steps. However, the indication used is only to be viewed for identification purposes and not as a suggestion as to an order for the steps.

The invention claimed is:

1. A method for making a thin film transistor, the method comprising of:
    (a) providing a plurality of carbon nanotubes and an insulating substrate;
    (b) flocculating the plurality of carbon nanotubes to acquire a carbon nanotube structure;
    (c) applying the carbon nanotube structure on the insulating substrate;
    (d) forming a source electrode, a drain electrode, and a gate electrode; and
    (e) covering the carbon nanotube structure with an insulating layer,
        wherein the source electrode and the drain electrode are connected to the carbon nanotube structure; and the gate electrode is electrically insulated from the carbon nanotube structure by the insulating layer,
    wherein step (a) further comprises following sub steps of:
        (a1) providing a substantially flat and smooth base;
        (a2) forming a catalyst layer on the substantially flat and smooth base;
        (a3) annealing the substantially flat and smooth base with the catalyst layer in air at a temperature in a range from about 700° C. to about 900° C. for about 30 to 90 minutes;
        (a4) heating the substantially flat and smooth base with the catalyst layer to a temperature in a range from about 400° C. to about 740° C. in a furnace with a protective gas therein;
        (a5) supplying a carbon source gas to the furnace for about 5 to about 30 minutes and growing the plurality of carbon nanotubes on the substantially flat and smooth base; and
        (a6) separating the plurality of carbon nanotubes from the substantially flat and smooth base.

2. A method for making a thin film transistor, the method comprising the steps of:
    (a') providing a plurality of carbon nanotubes and an insulating substrate;
    (b') forming a gate electrode, a source electrode, and a drain electrode;
    (c') covering the gate electrode with an insulating layer;
    (d') flocculating the plurality of carbon nanotubes to acquire a carbon nanotube structure; and (e') applying the carbon nanotube structure on the insulating layer;
    wherein the gate electrode is located on a surface of the insulating substrate; and the source electrode and the drain electrode are connected to the carbon nanotube structure, the carbon nanotube structure is insulated from the gate electrode by the insulating layer, and step (b') further comprises following sub steps of:

flocculating the plurality of carbon nanotubes in a solvent to obtain a carbon nanotube floccule structure;

filtering the solvent containing the carbon nanotube floccule structure through a microporous membrane; and drying the carbon nanotube floccule structure captured on the microporous membrane to obtain the carbon nanotube structure, step (a) further comprises following sub steps of:

(a1) providing a substantially flat and smooth base;

(a2) forming a catalyst layer on the substantially flat and smooth base;

(a3) annealing the substantially flat and smooth base with the catalyst layer in air at a temperature in a range from about 700° C. to about 900° C. for about 30 to 90 minutes;

(a4) heating the substantially flat and smooth base with the catalyst layer to a temperature in a range from about 400° C. to about 740° C. in a furnace with a protective gas therein;

(a5) supplying a carbon source gas to the furnace for about 5 to about 30 minutes and growing the plurality of carbon nanotubes on the substantially flat and smooth base; and (a6) separating the plurality of carbon nanotubes from the substantially flat and smooth base.

3. A method for making a thin film transistor, the method comprising:

(a) providing a plurality of carbon nanotubes and an insulating substrate;

(b) flocculating the plurality of carbon nanotubes to acquire a carbon nanotube structure;

(c) applying the carbon nanotube structure on the insulating substrate;

(d) forming a source electrode, a drain electrode, and a gate electrode; and (e) covering the carbon nanotube structure with an insulating layer, wherein the source electrode and the drain electrode are connected to the carbon nanotube structure; and the gate electrode is electrically insulated from the carbon nanotube structure by the insulating layer, and step (b) further comprises following sub steps of:

flocculating the plurality of carbon nanotubes in a solvent to obtain a carbon nanotube floccule structure;

filtering the solvent containing the carbon nanotube floccule structure through a microporous membrane; and drying the carbon nanotube floccule structure captured on the microporous membrane to obtain the carbon nanotube structure, step (a) further comprises following sub steps of:

(a1) providing a substantially flat and smooth base;

(a2) forming a catalyst layer on the substantially flat and smooth base;

(a3) annealing the substantially flat and smooth base with the catalyst layer in air at a temperature in a range from about 700° C. to about 900° C. for about 30 to 90 minutes;

(a4) heating the substantially flat and smooth base with the catalyst layer to a temperature in a range from about 400° C. to about 740° C. in a furnace with a protective gas therein;

(a5) supplying a carbon source gas to the furnace for about 5 to about 30 minutes and growing the plurality of carbon nanotubes on the substantially flat and smooth base; and (a6) separating the plurality of carbon nanotubes from the substantially flat and smooth base.

4. The method as claimed in claim 3, wherein in step (b), the plurality of carbon nanotubes are single-walled carbon nanotubes.

5. The method as claimed in claim 3, wherein the plurality of carbon nanotubes in the carbon nanotube structure are curved, disordered and entangled with each other.

6. The method as claimed in claim 3, wherein in step (a2), the catalyst layer comprises a material that is selected from the group consisting of iron, cobalt, nickel, magnesium, and alloys thereof.

7. The method as claimed in claim 3, wherein in step (a5), a carrier gas is introduced with the carbon source gas, the carrier gas and the carbon source gas are at a ratio ranging from 100:1 to 100:10.

8. The method as claimed in claim 3, wherein the insulating substrate comprises a material that is selected from the group consisting of p-type silicon, n-type silicon, silicon with a silicon dioxide layer formed thereon, glass, crystal, crystal with an oxide layer formed thereon, plastic, polymer, resin, and combinations thereof.

9. The method as claimed in claim 3, wherein the source electrode and the drain electrode are formed directly on the carbon nanotube structure.

10. The method as claimed in claim 3, further comprising a step (g) of eliminating at least some of metallic carbon nanotubes in the carbon nanotube structure.

11. The method as claimed in claim 10, wherein step (g) is performed after step (d), and comprises applying a voltage between the source electrode and the drain electrode to break down the metallic carbon nanotubes in the carbon nanotube structure.

12. The method as claimed in claim 10, wherein step (g) is performed after step (c), and comprises irradiating the carbon nanotube structure with a hydrogen plasma, microwave, terahertz, infrared, ultraviolet, or visible light, to break down the metallic carbon nanotubes in the carbon nanotube structure.

13. The method as claimed in claim 3, wherein in step (e), the insulating layer covers the source electrode and the drain electrode, and step (e) further comprises a sub step of exposing a part of the source electrode and the drain electrode from the insulating layer.

14. The method as claimed in claim 3, wherein step (b) further comprises a step of air-pumping the carbon nanotube floccule structure captured on the microporous membrane.

15. The method as claimed in claim 3, wherein the step of flocculating the plurality of carbon nanotubes in a solvent comprises a step of agitating the plurality of carbon nanotubes in the solvent to entangle the plurality of carbon nanotubes together.

16. The method as claimed in claim 3, wherein step (b) further comprises a step of shaping the carbon nanotube floccule structure after the step of filtering.

* * * * *